US005089955A

United States Patent [19]

Morinaga et al.

[11] Patent Number: 5,089,955

[45] Date of Patent: Feb. 18, 1992

[54] PROGRAMMABLE COUNTER/TIMER DEVICE WITH PROGRAMMABLE REGISTERS HAVING PROGRAMMABLE FUNCTIONS

[75] Inventors: Shigeki Morinaga; Mitsuru Watabe, both of Hitachi, Japan

[73] Assignee: Hitachi, Ltd., Tokyo, Japan

[21] Appl. No.: 484,909

[22] Filed: Feb. 26, 1990

Related U.S. Application Data

[63] Continuation of Ser. No. 284,388, Dec. 14, 1988, Pat. No. 4,930,100, which is a continuation of Ser. No. 793,350, Oct. 31, 1985, abandoned.

[30] Foreign Application Priority Data

Nov. 2, 1984 [JP] Japan .............................. 59-230202

[51] Int. Cl.[5] ........................ G06F 7/02; H03K 21/00

[52] U.S. Cl. ................................ 395/800; 364/259.2; 364/270.4; 364/DIG. 1

[58] Field of Search ... 364/200 MS File, 900 MS File, 364/569; 377/39, 49

[56] References Cited

U.S. PATENT DOCUMENTS

| | | | |
|---|---|---|---|
| 4,128,873 | 12/1978 | Lamiaux | 364/200 |
| 4,222,103 | 9/1980 | Chamberlin | 364/200 |
| 4,348,743 | 9/1982 | Dozier | 364/569 |
| 4,451,897 | 5/1984 | Murao | 364/900 |
| 4,618,968 | 10/1986 | Sibigtroth | 364/900 |
| 4,873,624 | 7/1989 | Sibigtroth | 364/200 |

FOREIGN PATENT DOCUMENTS

| | | |
|---|---|---|
| 0105932 | 10/1983 | European Pat. Off. . |
| 59-111420 | 6/1984 | Japan . |
| 2014764 | 8/1979 | United Kingdom . |
| 2027233 | 2/1980 | United Kingdom . |

OTHER PUBLICATIONS

*Microprocessors and Microcomputer Development Systems,* by Rafiquzzaman, published 8/19/83, pp. 50–99, 145–151, 605–609 & 617.

*Electronic Design,* Nov. 26, 1981, "Counter Chip Beefs Up μC Muscle", by MacMillan, pp. 195–201.

"Microcomputer Design in Digital Watches", *Implementing Functions: Microprocessors and Firmware,* by Piguet et al., pp. 80–91.

10e Congress International de Chronometrie, Sep. 11-14, 1979, Geneva, Proceedings, No. 3, pp. 271-278, "Conception d'un microprocesseur horloger"(not translated).

"8-Bit CMOS μC is Armed For Industrial Control", Electronic Design, Oct. 13, 1983, pp. 107-112.

"Mostek Z80 Microcomputer System", Handbook of Microcomputers and Minicomputers, 1979, Prentice-Hall, pp. 298-331.

"Centralized Interval Timer and Event Counter", IBM Technical Disclosure Buletin, vol. 17, No. 5, Oct. 1974, pp. 1455-1459.

"Programmable Timer—Counter", IBM Technical Disclosure Bulletin, vol. 20, No. 8, Jan. 1978, pp. 3282-3285.

"Low Cost Computer Timer", Chem, Biomed, and Enciron Instrumentation, 10(4), 1980, pp. 377-392.

"Controller Chip Takes on Many Industrial Computer Uses", Electronic Design, Aug. 4, 1982, pp. 165-173.

"Comparisons and Trends in Microprocessor Architecture", Computer Design, Sep. 1977, pp. 83-91.

"Programmable Multifunction Pulse Counter/Timer", IBM Technical Disclosure Bulletin, vol. 22, No. 4, 9/79, pp. 1348-1352.

*Primary Examiner*—Lawrence E. Anderson
*Attorney, Agent, or Firm*—Antonelli, Terry, Stout & Kraus

[57] ABSTRACT

A counter timer device includes a plurality of registers each capable of performing any of the function of a counter/timer register, the function of a capture register and the function of a compare register, in accordance with a command from a central processing unit, and a plurality of task registers corresponding to tasks which are to be carried out by using the above registers. Each of the task registers stores a task instruction for specifying a counter/timer register and a capture/compare register which are used in a task, and for specifying the operation mode of each of the specified registers. The task registers are scanned to successively read out the task instructions, and each of the read-out task instructions controls the operation of each of registers used in a corresponding task. Thus, tasks corresponding to the task instructions are all carried out at once.

8 Claims, 8 Drawing Sheets

| 30–27 | 26 | 25–22 | 21–18 | 17 | 16 | 15 |
|---|---|---|---|---|---|---|
| TASK NO. | INPUT/OUTPUT SPECIFYING BIT | COUNTER/TIMER REG. NO. | CAPTURE REG. NO. | CLOCK SPECIFYING BIT | COUNTING OPERATION CONTROL BIT | RESET CONTROL BIT |
| $k_1$ | 0 | $n_1$ | $m_1$ | 1 | 1 | — |

| 14 | 13–12 | 11–8 | 7–4 | 3–0 |
|---|---|---|---|---|
| POST-TRANSFER CONTROL BIT | — | CLOCK INPUT PIN NO. | CAPTURE SIGNAL INPUT PIN NO. | OUTPUT PIN NO. |
| 1 | — | $p_1$ | $q_1$ | — |

| 30–27 | 26 | 25–22 | 21–18 | 17 | 16 | 15 |
|---|---|---|---|---|---|---|
| TASK NO. | INPUT/OUTPUT SPECIFYING BIT | COUNTER/TIMER REG. NO. | CAPTURE REG. NO. | CLOCK SPECIFYING BIT | COUNTING OPERATION CONTROL BIT | RESET CONTROL BIT |
| $k_2$ | 0 | $n_2$ | $m_2$ | 1 | 1 | — |

| 14 | 13–12 | 11–8 | 7–4 | 3–0 |
|---|---|---|---|---|
| POST-TRANSFER CONTROL BIT | — | CLOCK INPUT PIN NO. | CAPTURE SIGNAL INPUT PIN NO. | OUTPUT PIN NO. |
| 0 | — | $p_2$ | $q_2$ | — |

| 30–27 | 26 | 25–22 | 21–18 | 17 | 16 | 15 |
|---|---|---|---|---|---|---|
| TASK NO. | INPUT/ OUTPUT SPECIFYING BIT | COUNTER/TIMER REG. NO. | COMPARE REG. NO. | CLOCK SPECIFYING BIT | COUNTING OPERATION CONTROL BIT | RESET CONTROL BIT |
| $k_3$ | 1 | $n_3$ | $m_3$ | 0 | 1 | 0 |

| 14 | 13 | 12 | 11–8 | 7–4 | 3–0 |
|---|---|---|---|---|---|
| POST-TRANSFER CONTROL BIT | POST-COINCIDENCE CONTROL BIT | LOGICAL VALUE SPECIFYING BIT | CLOCK INPUT PIN NO. | RESET INPUT PIN NO. | OUTPUT PIN NO. |
| — | 1 | 0 | — | — | $o_3$ |

| 30–27 | 26 | 25–22 | 21–18 | 17 | 16 | 15 |
|---|---|---|---|---|---|---|
| TASK NO. | INPUT/OUTPUT SPECIFYING BIT | COUNTER/TIMER REG. NO. | COMPARE REG. NO. | CLOCK SPECIFYING BIT | COUNTING OPERATION CONTROL BIT | RESET CONTROL BIT |
| $k_4$ | 1 | $n_4$ | $m_4$ | 0 | 1 | 1 |

| 14 | 13 | 12 | 11–8 | 7–4 | 3–0 |
|---|---|---|---|---|---|
| POST-TRANSFER CONTROL BIT | POST-COINCIDENCE CONTROL BIT | LOGICAL VALUE SPECIFYING BIT | CLOCK INPUT PIN NO. | RESET INPUT PIN NO. | OUTPUT PIN NO. |
| — | 0 | 0 | — | $q_4$ | $o_4$ |

PROGRAMMABLE COUNTER/TIMER DEVICE WITH PROGRAMMABLE REGISTERS HAVING PROGRAMMABLE FUNCTIONS

This application is a continuation of application Ser. No. 284,388, filed Dec. 14, 1988, U.S. Pat. No. 4,930,100, which is a continuation of Ser. No. 793,350, filed Oct. 31, 1985, now abandoned.

BACKGROUND OF THE INVENTION

The present invention relates to a counter/timer device, and more particularly to a programmable counter/timer device in which a counter/timer register and a capture/compare register both used for a timing operation can be freely selected from a register group made up of a plurality of registers.

In a conventional counter/timer LSI which is fabricated for and connected to a microcomputer, a single capture register and a single compare register are usually provided for each of a plurality of counter/timer registers, and it is impossible to change the functions of these registers. Further, an input terminal for applying a control signal from the outside to a counter/timer and an output terminal for delivering an output from the counter/timer to the outside are connected only to the counter/timer, and it is impossible to connect the input and output terminals to another counter/timer. Furthermore, a control register, through which a central processing unit sets the function of counter/timer register, is provided for each counter/timer register. For example, in the MC 6840 which is manufactured by Motorola Inc. and is a typical counter/timer LSI, three counter/-timer registers are provided, and one capture register, one control register, two input terminals and one output terminal are provided for each of the counter/timer registers. In the MC 6840, however, the contents of each counter/timer register is always compared with zero, and hence a compare register is absent in the strict sense. Further, the arrangement of these registers and input/output terminals is fixed.

A counter/timer incorporated in a single-chip microcomputer is discussed in, for example, an article entitled "Motorola's MC68HC11: Definition and Design of a VLSI Microcomputer" by J.M. Sibigtroth (IEEE MICRO, February, 1984). The single-chip microcomputer discussed in the above article has an excellent function. In this microcomputer, however, the number of counter/timer registers, the number of capture registers each for holding the number of input pulses, and the number of compare registers each for determining a time interval between pulse outputs are all fixed. Moreover, the functions of these registers as well as the combination of counter/timer registers and capture/compare registers are fixed. Accordingly, in a case where the single-chip microcomputer is applied to the control of various apparatuses, the counter/timer part of the microcomputer will be deficient in the selection of registers. Further, as to the arrangement of I/O pins, only the output terminal of a specified counter/-timer register can be selected from a plurality of terminals, but other terminals are fixed. Specifically, in a single-chip microcomputer, the number of I/O terminals is limited, and hence it is desirable to be able to freely change the connection between counter/timer registers and I/O terminals.

SUMMARY OF THE INVENTION

An object of the present invention is to provide a programmable counter/timer device in which the number of counter/timer registers, the number of capture registers and the number of compare registers can be freely changed, in order for the device to be used for controlling various apparatuses.

A characteristic feature of the present invention resides in that a counter/timer register, a capture register and a compare register are freely selected from a plurality of registers provided in a counter/timer device. Further, another characteristic feature of the present invention resides in that unlike the conventional counter/timer in which a control register is provided for each counter/timer register, a task register is provided for each of a plurality of tasks for controlling input and output processing, and a task instruction for selecting registers used as a counter/timer register, a capture register and a compare register, specifying the functions of the selected registers for the task concerned, and specifying input and output terminals, is written in the task register. Task registers in a counter/timer device are scanned to successively process the tasks, and thus the task instructions written in the task registers are executed at once.

BRIEF DESCRIPTION OF THE DRAWINGS

The present invention will be more apparent from the following detailed description of a preferred embodiment taken in conjunction with the accompanying drawings, in which.

DESCRIPTION OF THE PREFERRED EMBODIMENT

Figure 1:
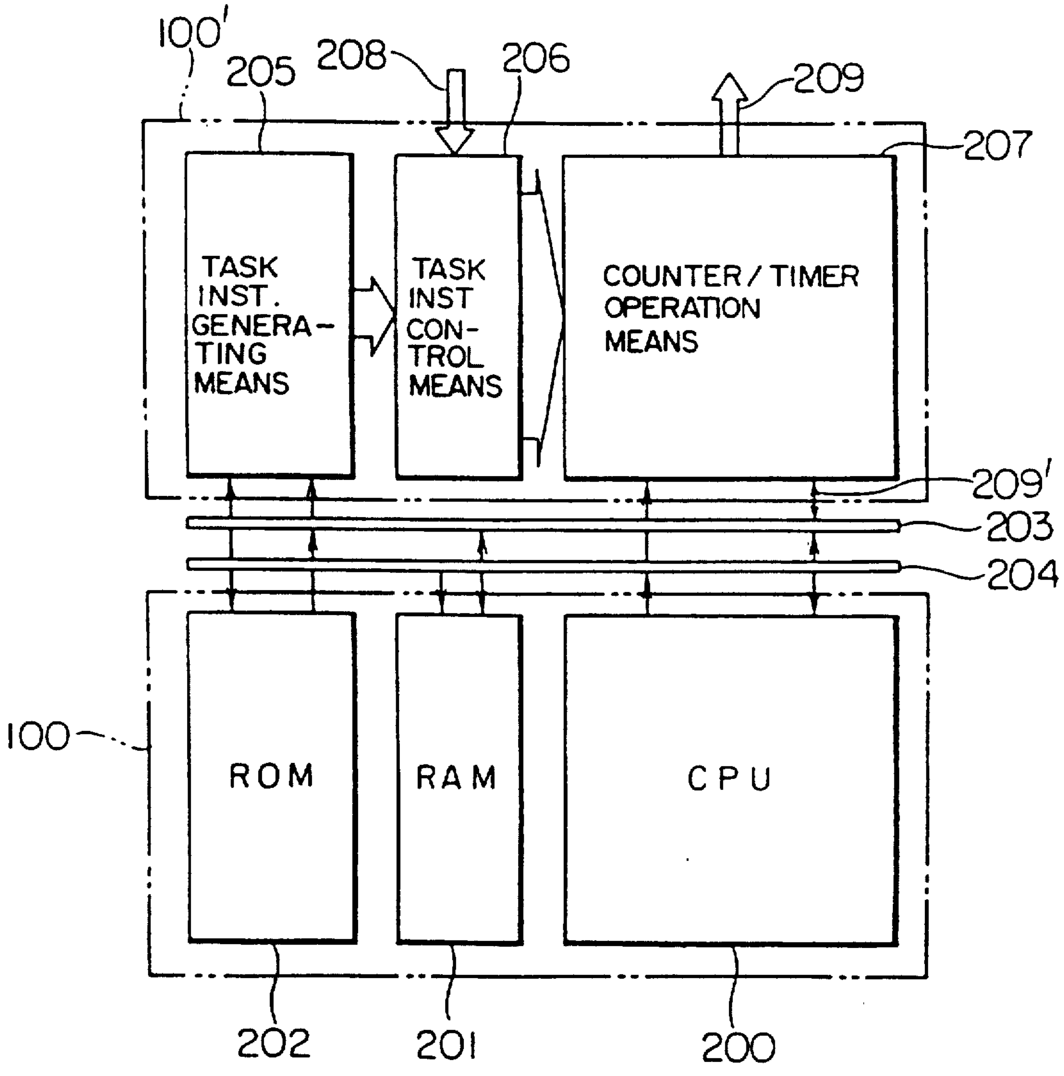
FIG. 1 is a block diagram showing an embodiment of a single-chip microcomputer, to which the present invention is applied.

FIG. 1 shows the outline of an embodiment of a single-chip microcomputer, to which the present invention is applied. Referring to FIG. 1, a microcomputer unit 100 is made up of a CPU (namely, a central processing unit) 200, a RAM 201 serving as a data storage means, and a ROM 202 serving as a program storage means. Further, a counter/timer unit 100' is made up of a task instruction generating means 205, a task instruction control means 206 and a counter/timer operation means 207. The microcomputer unit 100 is connected to the counter/timer unit 100' through a data bus 203 and an address/control bus 204.

The task instruction generating part 205 is formed mainly of a register group which stores task instructions for specifying registers and input/output terminals used in each task and for specifying the operation mode of each of the specified registers. In the embodiment of FIG. 1, the task instructions are sent from the microcomputer unit 100 to the task instruction generating means 205 through the data bus 203, to be stored in the register group. However, in a case where tasks to be carried out in the counter/timer unit 100' have been previously determined, task instructions for carrying out the above tasks may be previously stored in a ROM (namely, a read only memory), as needed. Further, this ROM may be a ROM whose contents can be altered, such as an erasable and programmable ROM or an electrically erasable and programmable ROM. The task instructions written in the task instruction generating means 205 are successively read out in a predetermined order, and sent to the counter/timer operation means 207 through the task instruction control means 206, to control the means 207. Thus, all of the task instructions are executed one at a time. Incidentally, in FIG. 1, reference numeral 208 designates an input terminal group for supplying a control signal from the outside to the task instruction control means 206, and 209 and 209' represent output terminal groups for delivering an output signal which corresponds to the result of arithmetic/logic operation performed in the counter/timer operation means 207, to the outside and the microcomputer unit 100.

The task instruction control means 206 generates a decoded signal for controlling the operating order and operation modes of constituent elements of the counter/timer operation means 207 in synchronism with an internal clock signal, on the basis of a task instruction from the task instruction generating means 205 and a control signal from the input terminal group 208.

The counter/timer operation means 207 performs various operations such as mentioned below. That is, in the means 207, a counter/timer register is incremented to perform a counter/timer function, the contents of a counter/timer register are transferred to a capture register, the contents of a counter/timer register are compared with the contents of a compare register, an output signal is delivered to the output terminal group 209, and so on.

Figure 2:
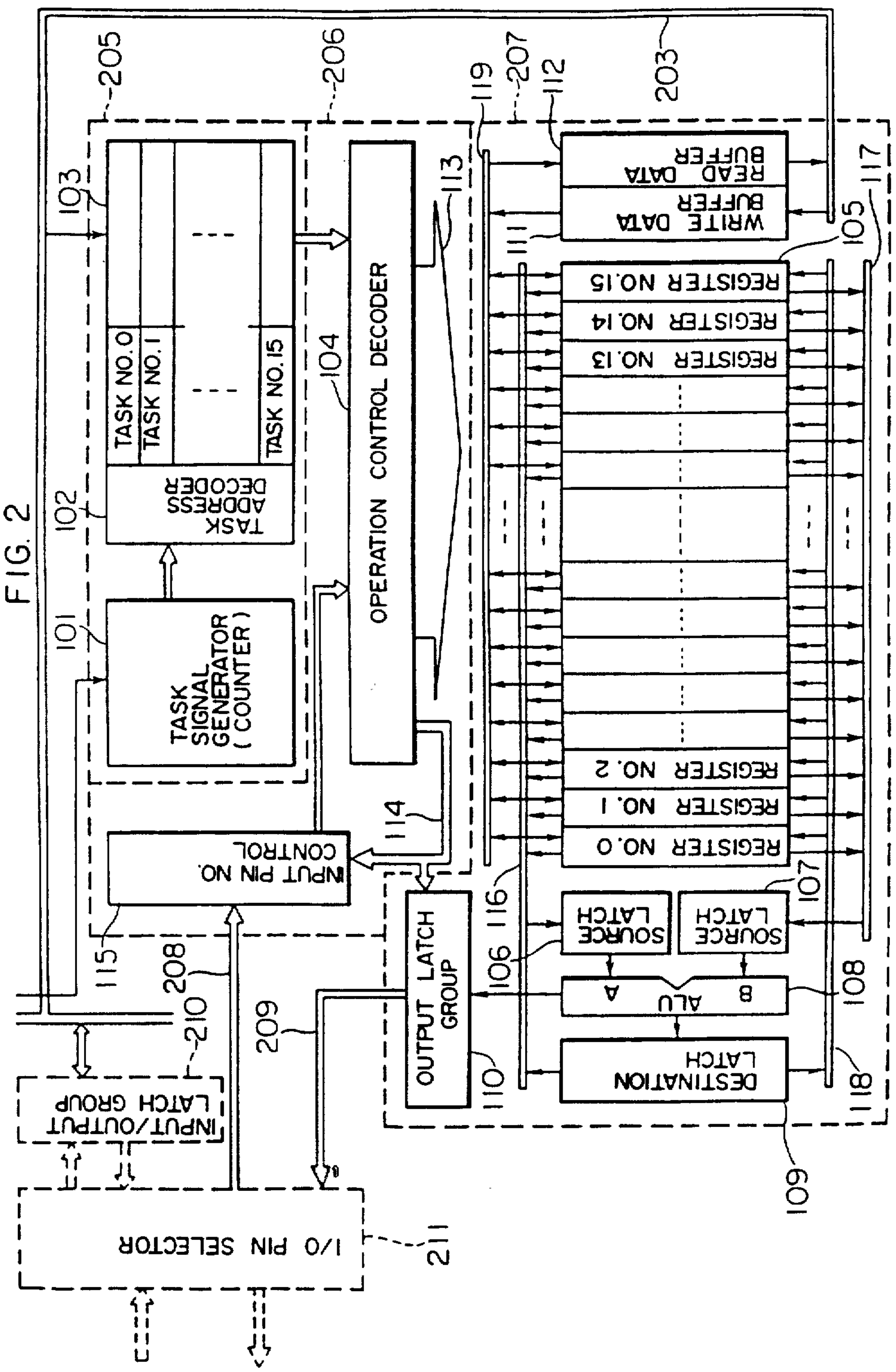
FIG. 2 is a block diagram showing a counter/timer unit according to the present invention, which is included in the single-chip microcomputer of FIG. 1.

FIG. 2 shows, in block, the detailed construction of the counter/timer unit 100'. Referring to FIG. 2, the task instruction generating means 205 includes a task signal generating circuit 101 which is formed of a counter in the present embodiment, a task address decoder 102, and a task register group 103 which is made up of sixteen task registers in the present embodiment. In order to control various apparatus connected externally to the single-chip microcomputer, it is necessary to carry out a large number of input/output processing tasks. In the prior art, at least one register set made up of a counter/timer register, a capture register, a compare register, a control register, an input terminal and an output terminal is selected for each processing task, and a central processing unit specifies the operation mode of the selected counter/timer register through the control register. In this case, however, the capture or compare register and the input or output terminal included in the selected register set may become useless depending upon the contents of the task, and thus the prior art system is very inefficient.

In contract, according to the present invention, a number of task instructions are stored in the task register group 103, and task numbers are successively generated by the task signal generating circuit 101. The task numbers are supplied to the task register group 103 through the task address decoder 102, to read out a task instruction from a task register corresponding to a task number specified by the task signal generating circuit 101 and to execute the read-out task instruction.

Figure 3:
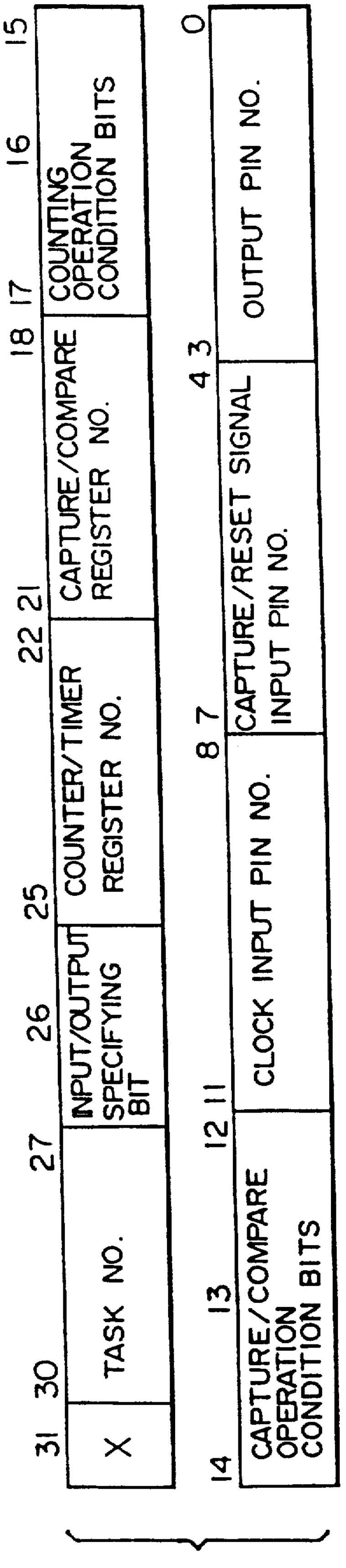
FIG. 3 is a schematic diagram showing the format of a task instruction used in the counter/timer unit of FIG. 2.

In the present embodiment, each task instruction, as shown in FIG. 3, is formed of 31 bits and includes a task number of 4 bits, an input or output specifying bit of one bit, a counter/timer register number of 4 bits, a capture/compare register number of 4 bits, a conditions in counting operation given by 3 bits, conditions in capture/compare operation given by 3 bits, a clock input pin number of 4 bits, a capture/reset signal input pin number of 4 bits, and an output pin number of 4 bits. The task instruction read out from the task register is applied to an operation control decoder 104, to generate a control signal 113 for the counter/timer operation means 207 and an input/output pin control signal 114. An input pin number control circuit 115 is used for controlling the application of signals from the input terminal group 208 to the operation control decoder 104.

The counter/timer operation means 207 includes a register group 105 which, in the present embodiment, is formed of 16 registers each capable of being specified as a desired one of a counter/timer register, a capture register and a compare register, the first source latch 106, the second source latch 107, an arithmetic unit (ALU) 108 for performing arithmetic/logical operations (such as incrementing operation, shift operation, etc.) in counter/timer processing, a destination latch 109 for supplying the result of the arithmetic/logic operation performed by the ALU 108 to buses 116 and 118, an output latch group 110 for delivering an output from the ALU 108 to the output terminal group 209, a write data buffer 111 for receiving data from the microcomputer unit 100 through the data bus 203 to write the data in the register group 105, and a read data buffer 112 for supplying data to the data bus 203.

When a task instruction is read out from a task register of the task register group 103, a register which is included in the register group 105 and specified by the task instruction, is accessed at an appropriate time by the action of the operation control decoder 104, to carry out a counter/timer operation and input/output processing. The ALU 108 performs operations such as the increment of an input thereto and the comparison between two inputs. The decoding operation may be unnecessary in the task instruction control means 206, if for example a task instruction is so designed that each bit of the task instruction corresponds to each of the operations of the counter/timer operation means 207.

The register group 105, the first source latch 106, the second source latch 107, the destination latch 109, the write data buffer 111 and the read data buffer 112 are connected to one another through at least one of the first and second read buses 116 and 117 each for inputting read data, a write bus 118 for outputting write data, and an interface bus 119 for receiving data from and supplying data to the data bus 203 of the microcomputer.

The output latch group 110 is used for holding the result of comparison obtained when a comparing operation is performed. An output from the output latch group 110 is given to the output terminal group 209. Which of output latches included in the latch group 110 is applied with the result of comparison from the ALU 108, is determined by the input/output pin control signal 114 from the operation control decoder 104.

Figure 4:
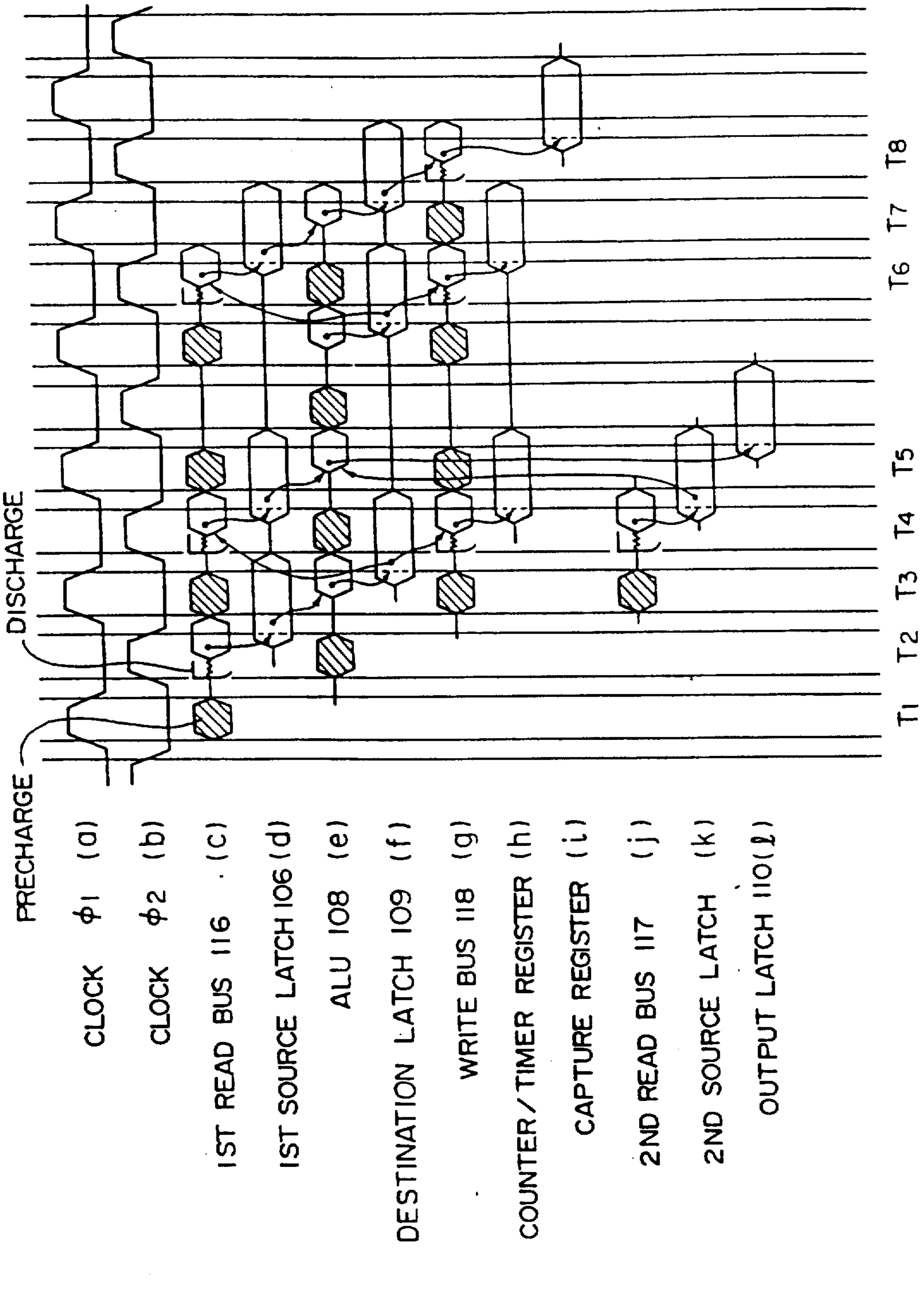
FIG. 4 is a timing chart showing the timing of operation in the counter/timer unit of FIG. 2.

FIG. 4 is a timing chart showing data flow in the counter/timer operation means 207. The counter/timer operation means 207 is operated by the first clock signal $\phi_1$ and the second clock signal $\phi_2$ which are shown in parts (a) and (b) of FIG. 4, respectively and are 180° out of phase with each other to form a two-phase clock signal. Further, the non-overlapping first and second clock signals $\phi_1$ and $\phi_2$ are also used as an internal clock signal of the microcomputer unit 100. Now, explanation will be made for a case where, on the basis of a task instruction, a counter/timer register is incremented and then the contents of the counter/timer register are compared with the contents of a compare register, by way of example. Part (c) of FIG. 4 shows the state of the first read bus 116. In a period $T_1$ when the first clock signal $\phi_1$ takes a level "1", the first read bus 116 is precharged. In a period $T_2$ when the second clock signal takes the level "1", the contents of a register which is included in the register group 105 and has been specified as a counter/timer register by the task instruction, is fetched to the first read bus 116, and hence the bus 116 begins to discharge in accordance with the fetched contents. Thus, the contents of the above register (namely, the counter/timer register) appears on the bus 116. The data on the bus 116 is latched by the first source latch 106 in the period $T_2$ when the second clock signal $\phi_1$ takes the level "1". Part (d) of FIG. 4 shows the state of the first source latch 106. As shown in part (d) of FIG. 4, the data on the bus 116 is latched by the first source latch 106 at the falling edge of the second clock signal $\phi_2$ in the period $T_2$. The data latched by the first source latch 106 is applied to an A-terminal of the ALU 108 which has been precharged in the period $T_2$ when the second clock signal $\phi_2$ takes the level "1". Data applied to a B-terminal of the ALU 108 is set to zero, since the task instruction has specified a mode in which the counter/timer register is incremented, and the input to the B-terminal is, therefore, not required. The ALU 108 performs an operation necessary for incrementing the counter/timer register, in accordance with a control signal from the operation control decoder 104. In other words, the ALU 108 increments the contents of the counter/timer register which are applied to the A-terminal, by one. The incremented data from the ALU 108 is applied to the destination latch 109, to be latched in a period $T_3$ when the first clock signal $\phi_1$ takes the level "1". Part (f) of FIG. 4 shows the state of the destination latch 109. Next, the output of the destination latch 109 is applied to the write bus 118 and first read bus 116 which have been precharged in the period $T_3$ when the first clock signal $\phi_1$ takes the level "1". The state of the bus 118 and the state of the bus 116 are shown in parts (g) and (c) of FIG. 4, respectively. In more detail, the first read bus 116 and the write bus 118 discharge in accordance with the contents of the destination latch 109, in a period $T_4$ when the second clock signal $\phi_2$ takes the level "1". Thus, data held by the destination latch 109 appears on the buses 116 and 118. The data on the first read bus 116 is written in the first source latch 106. While, the data on the write bus 118 is returned to the register which is included in the register group 105 and specified as the counter/timer register by the task instruction, as shown in part (h) of FIG. 4. In other words, the incremented data from the destination latch 109 is written in the first source latch 106 to prepare for the subsequent comparing operation, and is written in the register which is specified as the counter/timer register, to cause this register to act as a counter.

Reference data previously stored in a register which is included in the register group 105 and specified as a compare register, is written in the second source latch 107 through the second read bus 117. The write-in operation will be explained below, with reference to parts (j) and (k) of FIG. 4. Referring to part (j) of FIG. 4, the second read bus 117 is precharged in the period $T_3$ when the first clock signal $\phi_1$ takes the level "1", and discharges in accordance with the reference data held by the compare register, in the period $T_4$ when the second clock signal $\phi_2$ takes the level "1". Thus, the reference data of the compare register appears on the second read bus 117. The reference data on the bus 117 is written in the second source latch 107 in the period $T_4$ when the second clock signal $\phi_2$ takes the level "1", as shown in part (k) of FIG. 4.

The output of the first source latch 106 and the output of the second source latch 107 are applied to the A-terminal and B-terminal of the ALU 108, respectively. As soon as a comparing operation at the ALU 108 is completed in a period $T_5$ when the first clock signal $\phi_1$ takes the level "1", the result of the comparison is held by a latch which is included in the output latch group 110 and specified by the input/output pin control signal 114, as shown in part (l) of FIG. 4. It is to be noted that the precharge and discharge actions of each of the buses 116, 117 and 118 are controlled by control signals from the operation control decoder 104.

Next, explanation will be made for a case where data held by a counter/timer register is transferred to a capture register, on the basis of a task instruction.

Data held by a counter/timer register which is specified by a task instruction, is fetched into the first source latch 106, in the same manner as mentioned above. In order to transfer the data held by the counter/timer register to a capture register, it is necessary to send the data to the destination latch 109 as it is, and to write the output data of the destination latch 109 to a register which is included in the register group 105 and specified as a capture register by the task instruction, through the write bus 118.

Referring to part (c) of FIG. 4, the first read bus 116 discharges in accordance with the output of the destination latch 109 in a period $T_6$ when the second clock signal $\phi_2$ takes the level "1", to obtain the output of the destination latch 109 on the first read bus 116. The data on the bus 116 is written in the first source latch 106 as shown in part (d) of FIG. 4. The data written in the latch 106 is applied to the A-terminal of the ALU 108, and the ALU 108 writes the same data as applied to the A-terminal, in the destination latch 107 in a period $T_7$ when the first clock signal $\phi_1$ takes the level "1". The write bus 118 which has been precharged in the period $T_7$, discharges in accordance with the data of the destination latch 109 in a period $T_8$ when the second clock signal $\phi_2$ takes the level "1", to obtain the data of the destination latch 109 on the write bus 118 as shown in part (g) of FIG. 4. The data on the write bus 118 is written in the register which is included in the register group 105 and specified as a capture register by the task instruction, as shown in part (i) of FIG. 4.

Control signals for controlling constituent elements of the counter/timer operation means 207 in a predetermined order and in predetermined periods as mentioned above, are delivered from the operation control decoder 104 in accordance with a task instruction.

Next, explanation will be made of how the contents of a task instruction are varied depending upon the kind of task and what kind of output is obtained in accordance with the contents the task instruction.

In the format of a task instruction shown in FIG. 3, the 31st bit is not used, and task numbers specified by the 30th to 27th bits indicate addresses allotted to task registers of the task register group 103. In the present embodiment, each of 16 task registers is specified by the above four bits. For example, the first task register is specified by a value "0001" of the above four bits. The task instruction generating means 205 uses the bits 30–27 to load a task instruction received from the CPU 200 in the corresponding task register in accordance with the contents of the bits 30–27. Thus, the bits 30–27 may be unnecessary if the system is so modified that the CPU 200 itself loads a task instruction in the corresponding task register. The input/output specifying bit which is the 26th bit, indicates one of the input processing (that is, data in a register which is specified as a counter/timer register by a task instruction is transferred to a capture register, to be read out by the CPU) and the output processing (that is, reference data is written in a register which is specified as a compare register by a task instruction, to be compared with data in a register which is specified as a counter/timer register). In more detail, when the input/output specifying bit takes a value "0", the input processing is specified. When the above bit takes a value "1", the output processing is specified.

The counter/timer register number given by the 25th to 22nd bits indicates the number of the register which is included in the register group 105 and specified as a counter/timer register. For example, when the counter/timer register number takes a value "0011", the third register (namely, the register No. 3) in the register group 105 is the counter/timer register for the task instruction.

The capture/compare register number given by the 21st to 18th bits indicates the number of the register which is included in the register group 105 and specified as a capture or compare register. For example, when the capture/compare register number takes a value "0101", the fifth register (namely, the register No. 5) in the register group 105 is the capture register for a case where the CPU carries out the input processing on the basis of the task instruction, or the compare register for a case where the CPU carries out the output processing.

Conditions in counting operation given by the 17th to 15th bits indicate conditions, under which a counter/timer register performs a counting operation. The three bits include a clock specifying bit, a counting-operation control bit and a reset control bit. When the clock specifying bit takes a value "0", an internal clock signal is used as clock pulses for a counter/timer operation. When the clock specifying bit takes a value "1", an external clock signal is used as clock pulses for the counter/timer operation. The counting operation (namely, the increment of an input) is inhibited or allowed, in accordance with whether the counting-operation control bit takes the value "0" or "1". Further, when the reset control bit takes a value "0", a counter/timer register is not reset by an external trigger input from a specified input pin. When the reset control bit takes a value "1", the counter/timer register is reset by the external trigger input.

Conditions in capture/compare operation given by the 14th to 12th bits indicate whether or not a counter/timer register is reset after the transfer of data in the input processing, whether or not a counter/timer register is reset after the comparison between data in the output processing, and whether or not a logical value "1" is delivered for the result of comparison in the output processing. The 14th bit is a post-transfer control bit for controlling the operation of a counter/timer register after data stored in the counter/timer register has been transferred to a capture register. When the post-transfer control bit takes a value "0", the counter/timer register is not reset after the transfer of data. When the post-transfer control bit takes a value "1", the counter/timer register is reset after the transfer of data.

The 13th bit is a post-coincidence control bit for determining whether or not a counter/timer register is reset after data stored in the counter/timer has been judged to be coincident with data stored in a compare register, and the 12th bit is a logical value specifying bit for determining which of logical values "0" and "1" is outputted when data stored in a counter/timer register is judged to be coincident with or greater than data stored in a compare register.

In more detail, when the post-transfer control bit takes a value "0", the counter/timer register is not reset after data stored in the counter/timer register has coincided with data stored in the compare register. When the post-transfer control bit takes a value "1", the counter/timer register is reset after the above two data have coincided with each other. In a case where the logical value specifying bit takes a value "0", a logical value "0" is sent to a specified output pin in the output latch group when data stored in the counter/timer register coincides with or becomes greater than data stored in the compare register. In a case where the logical value specifying bit takes a value "1", a logical value "1" is sent to the specified output pin in the output latch group when data stored in the counter/timer register coincides with or becomes greater than data stored in the compare register.

The 11th to 8th bits specify the number of the clock input pin. In other words, when the external clock signal is specified by the 17th bit in a task instruction, one of external input/output pins which is specified by the above bits, is applied with the external clock signal.

The 7th to 4th bits specify the number of the capture/reset signal input pin. Similarly to the number of the clock input pin, the number of the pin which is included in the external input/output pins and is applied with a capture signal (that is, a transfer signal) in the input processing, or applied with a trigger signal for resetting a counter/timer register in the output processing, is indicated by the 7th to 4th bits.

The 3rd to 0-th bits specify the number of the pin which is included in the external input/output pins and used as an output pin in the output processing indicated by a task instruction.

Next, explanation will be made on examples of input-/output functions which can be realized by using the format of FIG. 3, with reference to FIGS. 5 to 12.

Figures 5, 6:
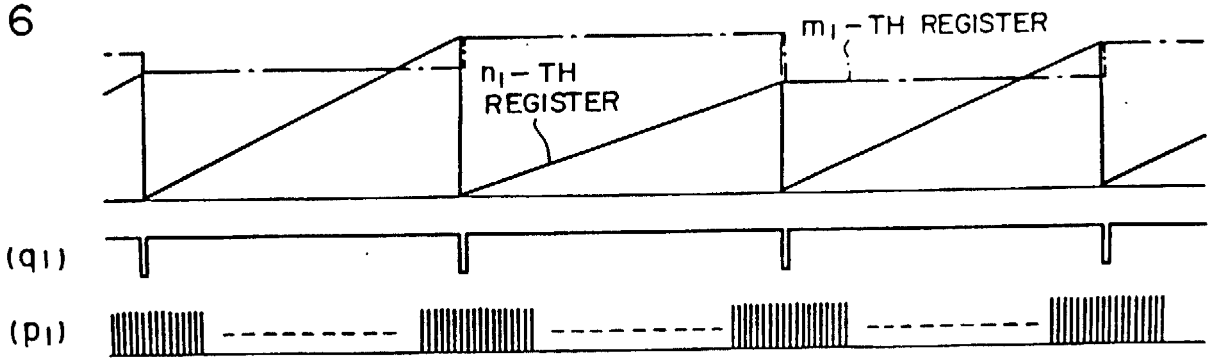
FIG. 5 is a schematic diagram showing the format of a task instruction for specifying a first processing example.
FIG. 6 is a waveform chart for explaining the execution of the task instruction given by the format of FIG. 5.

FIG. 5 shows a task instruction specifying the following operation. That is, a task instruction stored in the k-th task register of the task register group 103 specifies the input processing. The $n_1$-th and $m_1$-th registers of the register group 105 are used as a counter/timer register and a capture register, respectively. The counter/timer register performs a counting operation for an external clock signal ($p_1$) applied to the $p_1$-th pin. When a capture signal ($q_1$) applied to the $q_1$-th pin takes a level "0", data held by the counter/timer register (namely, the $n_1$-th register) is transferred to the capture register (namely, the $m_1$-th register), and then the counter/timer register (namely, the $n_1$-th register) is reset. In this case, the counter/timer operation part operates as shown in FIG. 6, in accordance with the task instruction. As is apparent from FIG. 6, the $n_1$-th register (namely, the counter/timer register) is reset each time a trigger pulse ($q_1$) from the $q_1$-th pin is applied to the counter/timer register, and counts up the external clock pulses ($p_1$) from the $p_1$-th pin. Further, the contents of the counter/timer register are transferred to the $m_1$-th register (namely, the capture register) each time the trigger pulse is applied to the $q_1$-th pin. It is to be noted that the contents of a register are given by analog representation in FIGS. 6, 8, 10 and 12.

Figures 7, 8:
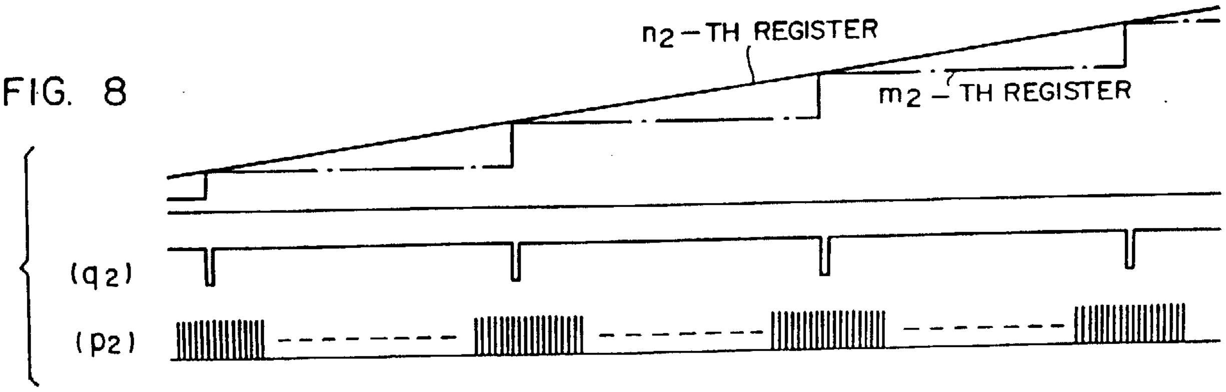
FIG. 7 is schematic diagram showing the format of a task instruction for specifying a second processing example.
FIG. 8 is a waveform chart for explaining the execution of the task instruction given by the format of FIG. 7.
Figures 9, 10:
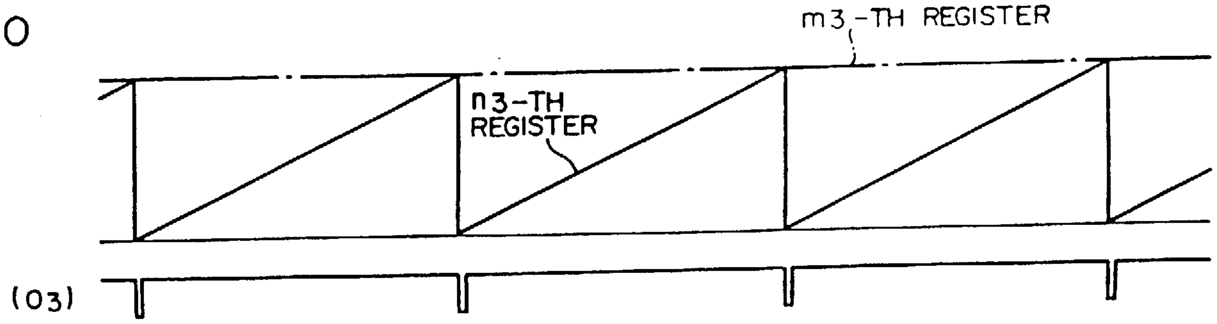
FIG. 9 is a schematic diagram showing the format of a task instruction for specifying a third processing example.
FIG. 10 is a waveform chart for explaining the execution of the task instruction given by the format of FIG. 9.

FIG. 7 shows a task instruction specifying the following operation. That is, the counter/timer operation part performs an operation similar to the operation specified by the task instruction of FIG. 5, but a counter/timer register (namely, the $n_2$-th register) continues a counting operation without being reset after data in the counter/timer register has been transferred to a capture register (namely, the $m_2$-th register), since the 14th bit has a value "0". In this case, the counter/timer operation part operates as shown in FIG. 8, in accordance with the task instruction. That is, the contents of the $n_2$-th register (namely, the counter/timer register) which counts up external clock pulses ($p_2$) supplied from a $p_2$-th pin, are transferred to the $m_2$-th register (namely, the capture register) each time a trigger pulse ($q_2$) from a $q_2$-th pin is applied to the counter/timer register FIG. 9 shows a task instruction for generating a constant interval or the like. Referring to FIG. 9, the task instruction is stored in the $k_3$-th task register of the task register group 103, and specifies the output processing since the 26th bit has a value "1". The $n_3$-th register and the $m_3$-th register of the register group 105 are used as a counter/timer register and a compare register, respectively.

The counter/timer register performs a counting operation for an internal clock signal, since the clock specifying bit (namely, the 17th bit) has a value "0". Data in the counter/timer register is compared with data in the compare register. When the data in the counter/timer register coincides with or becomes greater than the data in the compare register, a logical value "0" is delivered to the $o_3$-th pin and the counter/timer register is reset, since the logical value specifying bit (namely, the 12th bit) has a value "0" and the post-coincidence control bit (namely, the 13th bit) has a value "1". FIG. 10 shows the operation of the counter/timer operation part based upon the task instruction of FIG. 9. Referring to FIG. 10, when the contents of the $n_3$-th register (namely, the counter/timer register) coincide with the contents of the $m_3$-th register (namely, the compare register), an output pulse ($o_3$) is delivered to the $o_3$-th pin and the $n_3$-th register is reset.

Figures 11, 12:
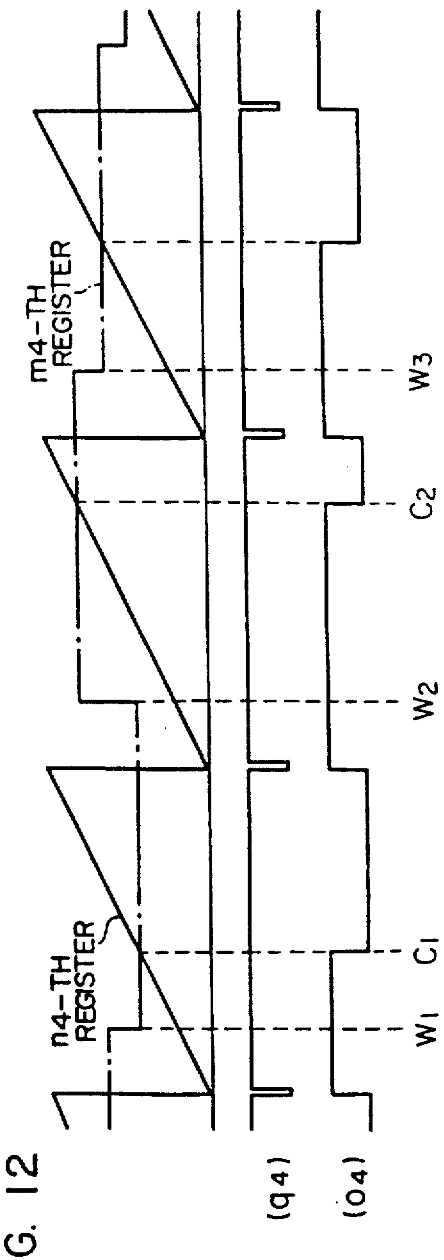
FIG. 11 is a schematic diagram showing the format of a task instruction for specifying a fourth processing example.
FIG. 12 is a waveform chart for explaining the execution of the task instruction given by the format of FIG. 11.

FIG. 11 shows a task instruction for controlling a duty ratio. Referring to FIG. 11, the task instruction is stored in the $k_4$-th task register of the task register group 103, and specifies the output processing since the 26th bit has a value "1". The $n_4$-th register and the $m_4$-th register of the register group 105 are used as a counter/timer register and a compare register, respectively, since the 25th to 22nd bits indicate the value "$n_4$" and the 21st to 18th bits indicate the value "$m_4$".

The counter/timer register performs a counting operation for an internal clock signal, since the 17th bit (namely, the clock specifying bit) has a value "0". The counter/timer register is reset by a reset pulse ($q_4$) from the $q_4$-th pin. Data in the counter/timer register is compared with data in the compare register. When the data in the counter/timer register coincides with or becomes greater than the data in the compare register, a logical value "0" is delivered to the $o_4$-th pin, since the 12th pin (namely, the logical value specifying bit) has a value "0".

FIG. 12 shows the operation of the counter/timer operation part based upon the task instruction of FIG. 11. It is to be noted that different reference data are written in the $m_4$-th register (namely, the compare register) at time moments $W_1$, $W_2$ and $W_3$. The $n_4$-th register (namely, the counter/timer register) counts up internal clock pulses (not shown). When the contents of the counter/timer register become greater than the contents of the compare register which has been loaded with the first reference data at the time moment $W_1$, at a time $C_1$, an output signal ($o_4$) supplied to the $o_4$-th pin is put to a level "0". The counter/timer register continues to count up the internal clock pulses, but is reset when the reset pulse ($q_4$) is applied to the $q_4$-th pin, since the reset control bit (the 15th bit) of the task instruction is set to "1". Thus, the contents of the counter/timer register become smaller than those of the compare register, and hence the output signal ($o_4$) is returned to a level "1". Thereafter, the compare register is loaded with the second reference data which is greater than the first reference data, at the time moment $W_2$. When the contents of the counter/timer register become equal to the second reference data at a time $C_2$, the output signal ($o_4$) is put to the level "0". As is apparent from FIG. 12, the task instruction of FIG. 11 produces an output waveform having different duty ratios.

When the task instructions of FIGS. 5, 7, 9 and 11 are stored in the task register group 103 of FIG. 2 and are successively scanned by the task signal generating circuit 101, the above-mentioned four counter/timer operations can be performed at once.

Referring back to FIG. 2, if an input/output latch group 210 is connected to the data bus 203 of the microcomputer, and an input/output pin selector 211 is provided for controlling the connection of the latch group 210 with the output terminal group 209 and input terminal group 208 by an instruction from the CPU, input/output pins which are not specified by task instructions to be executed, can be used as parallel I/O pins.

In each of the task instructions of FIGS. 5, 7, 9 and 11, only two different registers of the register group 105 are specified. However, the present invention is not limited to such task instructions, but a task instruction specifying three or more registers of the register group 105 can also be used.

Further, in a case where it is required only to count up internal clock pulses by a counter/timer register, only a single register of the register group 105 may be specified by a task instruction.

As is evident from the foregoing explanation, in a counter/timer device according to the present invention, different task instructions which are to be executed at once, can specify a single register of the register group in common. Moreover, the common register may be specified as a counter/timer register in a task instruction and as a compare register in another task instruction. Accordingly, a counter/timer device according to the present invention can perform a more complicated counter/timer operation, as compared with a conventional counter/timer device.

In short, according to the present invention, the number of counter/timer registers used in the input and output processing, the number of capture registers used in these processing and the number of compare registers used in the above processing are not fixed, but a counter/timer register, a capture register and a compare register can be freely selected from a register group by a simple instruction. Hence, a counter/timer device according to the present invention can be used for controlling various apparatuses.

Further, according to the present invention, desired pins can be freely selected from an external pin group by a task instruction, and therefore the pin group can be used very effectively. Accordingly, a counter/timer device according to the present invention is advantageously incorporated in a single-chip microcomputer, in which the number of input/output pins is limited.

When the clock signals $\phi_1$ and $\phi_2$ do not utilize the memory cycle of the CPU but utilize the machine cycle, a single-chip microcomputer including a counter/timer device according to the present invention has a high processing speed, and exhibits an excellent performance.

Further, according to the present invention, various functions in the input and output processing can be set by simple task instructions. That is, a counter/timer device according to the present invention has a high degree of freedom.

We claim:

1. A programmable pulse input/output processing system, comprising:

a microcomputer including a central processing unit; and a programmable pulse input/output processing unit connected to said microcomputer through a system bus, said programmable pulse input/output processing unit comprising:

(a) task instruction generating means for generating task instructions corresponding to pulse processing operations;

(b) operation means for performing pulse processing operations, and including (a) a register group made up of a plurality of registers each being selectively programmable to perform any of a plurality of register functions necessary for said pulse processing operations, said plurality of register functions including a counter/timer function, a compare function and a capture function, such that the number of counter/timer function registers, compare function registers and capture function registers can be freely changed to control various operations of said microcomputer, (b) an arithmetic unit for performing an arithmetic/logic operation on the basis of data from said register group, and (c) bus means for transferring data between said register group and said arithmetic unit;

(c) interface bus means for transferring data between said register group and said central processing unit through said system bus; and (d) task instruction control means connected to said task instruction generating means and said operation means, and being responsive to a task instruction generated by said task instruction generating means, for specifying at least one of said plurality of registers included in said register group of said operation means to be used for a particular pulse processing operation, and for causing said arithmetic unit to perform an arithmetic/logic operation corresponding to said task instruction on the basis of data contained in said at least one of said plurality of registers.

2. A microcomputer chip comprising:

a central processing unit, and a pulse input/output processing unit connected to said central processing unit, said pulse input/output processing unit comprising:

a plurality of I/O terminal pins for receiving signals from and sending signals to said central processing unit;

task instruction generating means for generating task instructions specifying counter/timer operations, registers to be used in performing said counter/-timer operations and I/O terminal pins to be employed in receiving signals from and sending signals to said central processing unit in performing said counter/timer operations;

counter/timer operation means coupled to said I/O terminal pins for performing counter/timer operations including (a) a register group made up of a plurality of registers each being selectively programmable to perform any of a plurality of register functions necessary for said counter/timer operations, said plurality of register functions including a counter/timer function, a compare function and a capture function such that the number of counter/-timer function registers, compare function registers and capture function registers can be changed to accommodate various counter/timer operations, (b) arithmetic unit means for performing an arithmetic/logic operation on the basis of data from said register group, and (c) bus means for transferring data between said register group and said arithmetic unit means; and task instruction control means connected to said task instruction generating means and said counter/-timer operation means, and being responsive to a task instruction generated by said task instruction generating means, for specifying (i) at least one I/O terminal pin for receipt of signals from or for supplying signals to said control processing unit and (ii) at least one of said plurality of registers included in said register group of said counter/timer operations means to be used for a particular counter/timer operation which is responsive to a signal received on said specified I/O terminal pin or which supplies a resultant signal to said specified I/O terminal pin, and for causing said arithmetic unit means to perform an arithmetic/logic operation corresponding to said particular counter/timer operation specified by said task instruction on the basis of data contained in said at least one of said plurality of registers.

3. A microcomputer chip comprising:

a central processing unit, and a pulse input/output processing unit connected to said central processing unit, said pulse input/output processing unit comprising:

a plurality of I/O terminal pins for receiving signals from and sending signals to an external device;

task instruction generating means for successively generating task instructions specifying counter/-timer operations, registers to be used in performing said counter/timer operations and I/O terminal pins to be employed in receiving signals from and sending signals to said external device in performing said counter/timer operations;

counter/timer operation means coupled to said I/O terminal pins for performing counter/timer operations including (a) a register group made up of a plurality of registers each being selectively programmable to perform any of a plurality of register functions necessary for said computer/timer operations, said plurality of register functions including a counter/timer function, a compare function and a capture function such that the number of counter/-timer function registers, compare function registers and capture function registers can be changed to accommodate various counter/timer operations, (b) arithmetic unit means for performing an arithmetic/logic operation on the basis of data from said register group, and (c) bus means for transferring data between said register group and said arithmetic unit means; and task instruction control means connected to said task instruction generating means and said counter/-timer operation means, and being responsive to a task instruction generated by said task instruction generating means, for specifying (i) at least one I/O terminal pin for receipt of signals from or for supplying signals to said external device and (ii) at least one of said plurality of registers included in said register group of said counter/timer operation means to be used for a particular counter/timer operation which is responsive to a signal received on said specified i/o terminal pin or which supplies a resultant signal to said specified I/O terminal pin, and for causing said arithmetic unit means to perform an arithmetic/logic operation corresponding to said particular counter/timer operation specified by said task instruction on the basis of data contained in said at least one of said plurality of registers.

4. A microcomputer chip comprising:

a central processing unit, and a pulse input/output processing unit connected to said central processing unit, said pulse input/output processing unit comprising:

a plurality of I/O terminal pins for receiving signals from and sending signals to an external device;

task instruction generating means for generating a task instruction which specifies (1) an input counter/timer operation, (2) a first register to serve as a counter/timer register, (3) a second register to serve as a capture register, (4) a first I/O terminal pin for receipt of a clock signal from said external device and (5 ) a second I/O terminal pin for receipt of a capture signal from said external device;

counter/timer operation means coupled to said I/O terminal pins for performing counter/timer operations including (a) a plurality of registers selectable in accordance with said task instruction for performing selected register functions necessary for said counter/timer operations, (b) arithmetic unit means for performing an arithmetic/logic operation on data from a selected register or registers, and (c) bus means for transferring data between said registers and said arithmetic unit means; and task instruction control means connected to said task instruction generating means and said counter/-timer operation means, and being responsive to said task instruction generated by said task instruction generating means, (i) for specifying a first one of said plurality of registers to serve as a counter/-timer register and a second one of said registers to serve as a capture register such that the counter/-timer register and the capture function register can be selected by said task instruction control means to accommodate various counter/timer operations, (ii) for controlling said arithmetic unit means to count clock signals receiving on said first I/O terminal pin specified by said task instruction and to store said count in said first register, and (iii) for controlling said first and second register to transfer a count in said first registers to said second register in response to receipt of a capture signal on said second I/O terminal pin specified by said task instruction.

5. A microcomputer chip comprising:

a central processing unit, and a pulse input/output processing unit connected to said central processing unit, said pulse input/output processing unit comprising:

a plurality of I/O terminal pins for receiving signals from and sending signals to an external device;

task instruction generating means for generating a task instruction which specifies (1) an input counter/timer operation, (2) a first register to serve as a counter/timer register, (3) a second register to serve as a compare register, and (4) a first I/O terminal pin for sending an output signal to said external device;

counter/timer operation means coupled to said I/O terminal pins for performing counter/timer operations including (a) a plurality of registers selectable in accordance with said task instruction for performing selected register functions necessary for said counter/timer operations, (b) arithmetic unit means for performing an arithmetic/logic operation on data from a selected register or registers, and (c) bus means for transferring data between said registers and said arithmetic unit means; and task instruction control means connected to said task instruction generating means and said counter/-timer operation means, and being responsive to said task instruction generated by said task instruction generating means, (i) for specifying a first one of said plurality of registers to serve as a counter/-timer register and a second one of said registers to serve as a compare register such that the counter/- timer register and the compare function register can be selected by said task instruction means to accommodate various counter/timer operations, (ii) for controlling said arithmetic unit means to periodically increment a value stored in said first register, (iii) for comparing the contents of said first register with a value stored in said second register, and (iv) applying an output signal to said first I/O first pin specified by said task instruction when coincidence is detected between the contents of said first and second registers.

6. A microcomputer chip comprising:

a central processing unit, and a programmable pulse input/output processing unit connected to said central processing unit, said programmable pulse input/output processing unit comprising:

(A) task instruction generating means for generating a plurality of task instructions corresponding to counter/timer operations;

(B) counter/timer operation means for performing counter/timer operations and including (a) a register group made up of a plurality of registers each being selectively programmable to perform any of a plurality of register functions necessary for said counter/timer operations, said plurality of register functions including a counter/timer function, a compare function, and a capture function, such that the number of counter/timer registers, compare function registers and capture function registers can be changed to control various operations of said programmable pulse input/output processing unit, (b) arithmetic unit means for performing an arithmetic/logic operation on the basis of data from said register group, and (c) bus means for transferring data between said register group and said arithmetic unit means;

(C) interface bus means for transferring data between said group and said central processing unit through said data bus; and (D) task instruction control means connected to said task instruction generating means and said counter/timer operation means, and being responsive to a task instruction generated by said task instruction generating means, for specifying at least one of said plurality of registers included in said register group of said counter/timer operation means to be used for a particular counter/timer operation, and for causing said arithmetic unit means to perform an arithmetic/logic operation corresponding to said task instruction on the basis of data contained in said at least one of said plurality of registers.

7. A microprocessor comprising:

a central processing unit, and a programmable pulse input/output processing unit connected to said central processing unit, said programmable pulse input/output processing unit comprising:

(A) task instruction generating means for generating a plurality of task instructions corresponding to counter/timer operations;

(B) counter/timer operation means for performing counter/timer operations and including (a) a register group made up of a plurality of registers each being selectively programmable to perform any of a plurality of register functions necessary for said counter/timer operations, said plurality of register functions including a counter/timer function, a compare function, and a capture function, such that the number of counter/timer registers, compare function registers and capture function registers can be changed to control various operations of said programmable pulse input/output processing unit, (b) arithmetic unit means for performing an arithmetic/logic operation on the basis of data from said register group, and (c) bus means for transferring data between said register group and said arithmetic unit means;

(C) interface bus means for transferring data between said group and said central processing unit through said data bus; and (D) task instruction control means connected to said task instruction generating means and said counter/timer operation means, and being responsive to a task instruction generated by said task instruction generating means, for specifying at least one of said plurality of registers included in said register group of said counter/timer operation means to be used for a particular counter/timer operation, and for causing said arithmetic unit means to perform an arithmetic/logic operation corresponding to said task instruction on the basis of data contained in said at least one of said plurality of registers.

8. A counter/timer device for use with a microcomputer to perform counter/timer operations for said microcomputer, comprising:

a plurality of I/O terminal pins for receiving signals from and sending signals to said microcomputer;

task instruction generating means for generating task instructions specifying counter/timer operations and registers to be used in performing said counter/timer operations;

counter/timer operation means coupled to said I/O terminal pins for performing counter/timer operations including (a) a register group made up of a plurality of registers each being selectively programmable to perform any of a plurality of register functions necessary for said counter/timer operations, said plurality of register functions including a counter/timer function, a compare function and a capture function, such that the number of counter/timer function registers, compare function registers and capture function registers can be freely changed to accommodate various counter/timer operations, (b) an arithmetic unit for performing an arithmetic/logic operation on the basis of data from said register group, and (c) bus means for transferring data between said register group and said arithmetic unit; and task instruction control means connected to said task instruction generating means and said counter/timer operation means, and being responsive to a task instruction generated by said task instruction generating means, for specifying (i) at least one I/O terminal pin for receipt of signals from or for supplying signals to said microcomputer, and (ii) at least one of said plurality of registers included in said register group of said counter/timer operation means to be used for a particular counter/timer operation which is responsive to a signal received on said specified I/O terminal pin or which supplies a resultant signal to said specified I/O terminal pin, and for causing said arithmetic unit to perform an arithmetic logic operation corresponding to said particular counter/timer operation specified by said task instruction on the basis of data contained in said at least one of said plurality of registers.

* * * * *